(12) United States Patent
Kojo et al.

(10) Patent No.: US 8,691,326 B2
(45) Date of Patent: Apr. 8, 2014

(54) METHOD FOR MANUFACTURING SOLAR CELL ELECTRODE

(75) Inventors: Hiroki Kojo, Tochigi (JP); Masakatsu Kuroki, Kanagawa (JP); Hisashi Matsuno, Tokyo (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 104 days.

(21) Appl. No.: 13/432,371

(22) Filed: Mar. 28, 2012

(65) Prior Publication Data

US 2013/0160836 A1    Jun. 27, 2013

(30) Foreign Application Priority Data

Apr. 1, 2011   (JP) .................. 2011-081958

(51) Int. Cl.
*B05D 5/12*   (2006.01)
*B05D 3/06*   (2006.01)

(52) U.S. Cl.
USPC ............ 427/74; 427/58; 427/98.4; 427/99.2; 427/123; 427/553; 427/558

(58) Field of Classification Search
USPC .......... 427/58, 98.4, 99.2, 117, 123, 553, 558
See application file for complete search history.

(56) References Cited

U.S. PATENT DOCUMENTS

| 5,151,377 A * | 9/1992 | Hanoka et al. ................ 438/98 |
| 8,093,491 B2 * | 1/2012 | Sridharan et al. ............ 136/256 |
| 8,236,598 B2 * | 8/2012 | Khadilkar et al. ............. 438/72 |
| 2009/0025782 A1 * | 1/2009 | Ojima et al. ................. 136/255 |
| 2010/0039034 A1 * | 2/2010 | Ito et al. ........................ 313/583 |
| 2010/0294353 A1 | 11/2010 | Takahashi |
| 2011/0088769 A1 * | 4/2011 | Hang et al. ................... 136/256 |
| 2011/0225815 A1 * | 9/2011 | Sanada .......................... 29/829 |
| 2012/0192932 A1 * | 8/2012 | Wu et al. ...................... 136/252 |

FOREIGN PATENT DOCUMENTS

| JP | 06-029559 A | 2/1994 |
| JP | 07-073730 A | 3/1995 |
| JP | 09-275221 A | 10/1997 |
| JP | 3374647 B2 | 2/2003 |
| JP | 2009-170577 A | 7/2009 |
| JP | 2011-005404 A | 1/2011 |

* cited by examiner

*Primary Examiner* — Brian K Talbot

(57) ABSTRACT

A method for manufacturing a solar cell electrode, comprising the steps of: (a) applying a conductive paste for bus electrode to a wafer in order to form a bus electrode pattern; (b) depositing onto the wafer a photocurable conductive paste for finger electrode from a discharge slot of a dispenser nozzle to thereby form an uncured finger electrode pattern on the wafer, wherein the nozzle moves parallel to the wafer; and (c) curing the uncured finger electrode pattern by exposing the uncured finger electrode pattern to UV light either after forming the uncured finger electrode pattern on the wafer in the step (b), or concurrent with the step (b).

12 Claims, No Drawings

METHOD FOR MANUFACTURING SOLAR CELL ELECTRODE

FIELD OF THE INVENTION

The present invention is directed to a method for fabricating solar cell electrodes. The present invention also relates to a solar cell electrode made therefrom.

TECHNICAL BACKGROUND OF THE INVENTION

A solar cell structure with a p-type base has a negative electrode that is typically on the front-side or sun side of the cell and a positive electrode on the backside. When solar radiation of an appropriate wavelength falls on a p-n junction of a semiconductor body, hole-electron pairs are generated in that body. Holes and electrons move across the junction in opposite directions and thereby give rise to flow of an electric current through the contacts disposed on the front-side and backside, which is capable of delivering power to an external circuit. The contact on the front side is generally made in the form of a grid comprising widely-spaced thin metal lines, or fingers, that supply current to a larger bus bar. The back contact is generally not constrained to be formed in multiple thin metal lines, since it does not prevent incident light from striking solar cell.

In order to increase the power generation characteristics of the solar cell the characteristic of the conversion efficiency EFF (%) is particularly important factor among the factors determining the efficiency of a solar cell. In order to increase the conversion efficiency, suitable electrode (grid) design is such as to attain high conduciveness, to cause electrons to move efficiently and to not decrease the area of the front surface on which solar radiation is incident. As a result; the power generation efficiency is increased. In order to achieve this objective, a variety of solar cell manufacturing techniques for fabricating electrodes having a high-aspect ratio for a solar cell by applying a conductive paste having a predetermined viscosity range (for example, by screen-printing) and for attaining superior conversion efficiency EFF (%) have been proposed.

A process for forming solar cell electrodes having a high aspect ratio, which attains superior conversion efficiency EFF (%) by screen-printing a conductive paste containing carbon fibers have been disclosed in US-2010-0294353 A1. The process described therein involves the screen printing and there are limitations to the aspect ratio of the formed electrode by screen printing. Moreover, the aspect ratio of the formed electrode is decreased after the firing process.

Japanese published patent application No. 2011-5404 (Kokai) describes a printing method and a device for forming solar cell electrodes by applying conductive paste through the discharge slot of a nozzle dispenser onto the wafer. Despite the numerous techniques utilized, a need still exists for electrodes for solar cells having superior conversion efficiency EFF (%), while increasing the requirement for reducing damage to global environment and cost reduction.

Solar cell electrodes are composed of collector electrodes (finger electrodes) and connector electrodes (bus electrodes). It is important that the finger electrodes be formed with a narrow line width so that more light can enter the front surface of the wafer. Thus, there is a need for a conductive paste capable of forming fine lines with a high aspect ratio. For the bus electrodes, particularly important features include high conductivity, tab connections, and adhesive strength.

The functions required for the finger electrodes and the bus electrodes are different. However, it has been a common practice to form both the finger electrodes and the bus electrodes with the same conductive paste suited to forming the finger electrodes.

SUMMARY OF THE INVENTION

In one aspect, the present invention relates to a method for manufacturing a solar cell electrode, comprising the steps of: (a) applying a conductive paste for bus electrode to a wafer in order to form a bus electrode pattern; (b) depositing onto the wafer a photocurable conductive paste for finger electrode from a discharge slot of a dispenser nozzle to thereby form an uncured finger electrode pattern on the wafer, wherein the nozzle moves parallel to the wafer; and (c) curing the uncured finger electrode pattern by exposing the uncured finger electrode pattern to UV light either after forming the uncured finger electrode pattern on the wafer in the step (b), or concurrent with the step (b).

Another aspect of the present invention relates to a solar cell electrode manufactured by the solar cell electrode manufacturing method described above.

DETAILED DESCRIPTION OF THE INVENTION

Solar Cell Electrode Manufacturing Method

In the first embodiment of the present invention, two different conductive pastes, a conductive paste for bus electrode and a photocurable conductive paste for finger electrode, are used in the solar cell electrode manufacturing method. In one embodiment, the bus electrode may be highly conductive so as to favorably achieve the function thereof. In this case, an embodiment may be configured in which the content (wt %) of conductive powder and other inorganic solids in the paste may be greater than the inorganic solids content of the photocurable conductive paste for the finger electrode. In general, the bus electrode is much thicker than the finger electrode, and has a greater area of contact with the wafer. Thus, the bus electrode is highly liable to various problems such as shrinkage, cracking and peeling from the wafer when subjected to firing and other processing. In one embodiment, the inorganic solids content of the paste (dried film) can be increased to avoid this problem. Moreover, in the present invention it is not absolutely necessary to use a photocurable conductive paste, or to employ a nozzle discharge system in the formation of the bus electrode. This means that the requirements of the bus electrode can be addressed even when the paste for the bus electrode has a relatively large inorganic solids content.

In one embodiment, the finger electrode provided on the light receiving surface of the solar cell is designed with the smallest possible line width so as to maximize the area of the light receiving surface. From the standpoint of lowering the electrical resistance of the electrode, it is preferably designed so as to ensure the largest possible cross-sectional area of the electrode. That is, a fine electrode design with a high aspect ratio is ideal. Thus, effective photocuring of the electrode pattern is extremely desirable with the photocurable paste for the finger electrode. In one embodiment, the inorganic solids content of the paste is made relatively small to allow for the passage of the light required for photocuring in this case. In another embodiment, the inorganic solids content of the paste is made relatively small and the paste viscosity is kept relatively low from the standpoint of achieving efficient application by nozzle discharge. Because of the small line width, moreover, the likelihood of shrinkage, cracking, peeling from the wafer and other problems occurring during firing and other processing is less than it is with the bus electrode even though the inorganic solids content of the paste is relatively low.

Thus, in one embodiment, by using two different conductive pastes as the conductive paste for the bus electrode and the photocurable conductive paste for the finger electrode, and by making the inorganic solids content of the conductive paste for the bus electrode greater than the inorganic solids content of the photocurable conductive paste for the finger electrode in another embodiment, it is possible to provide a solar cell electrode in a form that is advantageous for both the bus electrode and finger electrode, and especially in a form that is advantageous from the standpoint of both the adhesive strength of the bus electrode and the preparation method (application of photocurable conductive paste by nozzle discharge) of the finger electrode.

Conventionally, by contrast, forming both the finger electrode and the bus electrode using a conductive paste suited to the finger electrode is advantageous for preparing a finger electrode with a high aspect ratio. However, it may be difficult to secure high conductivity of the bus electrode, and cracking and peeling are likely when there is a firing step. On the other hand, forming the bus electrode and the finger electrode using a conductive paste suited to the bus electrode is advantageous for increasing the adhesive strength and avoiding the risk of cracks and peeling in the bus electrode, but disadvantageous for forming a finger electrode with a high aspect ratio.

The methods for calculating the "inorganic solids content of the conductive paste for the bus electrode" and "inorganic solids content of the photocurable conductive paste for the finger electrode" are discussed below.

The solar cell electrode manufacturing method of the first embodiment of the present invention comprises (a) a step of forming a bus electrode pattern, (b) a step of forming a finger electrode pattern, and (c) a step of exposing the finger electrode pattern to UV light.

(a) Bus Electrode Pattern Formation Step

The conductive paste for forming the bus electrode is applied to a wafer to form a bus electrode pattern in this step. Examples of the wafer here include silicon wafers in solar cells.

Conductive Paste for Bus Electrode

In one embodiment, the conductive paste for the bus electrode contains conductive metal particles and glass frit. In one embodiment, as discussed above, the inorganic solids content (wt %) of the conductive paste for the bus electrode is larger than the inorganic solids content (wt %) of the photocurable paste for the finger electrode.

A curable (photocurable or thermally curable) conductive paste such as the photocurable conductive paste for the finger electrode discussed below or a conductive paste of a non firing type can be used, but from the standpoint of increasing the inorganic solids content, a conductive paste of a non-curable (non-photocurable, non-thermally-curable) type is used in one embodiment. In another embodiment, a firing type conductive paste is used.

Physical Properties, etc. of Conductive Paste for Bus Electrode

The inorganic solids content of the conductive paste for the bus electrode is the inorganic solids content (wt %) after formation and drying of the bus electrode. That is, it is calculated as the percentage (wt %) of inorganic solids relative to the total weight of the conductive paste for the bus electrode (excluding solvent). This corresponds to the weight of the coated film after firing, based on the weight of the coated film of paste after the solvent has been removed by drying, expressed as wt %. The inorganic solids typically consist of conductive metal particles and glass frit.

More specifically, the inorganic solids content (wt %) may be 90 to 99.1 wt % in one embodiment, or 94 to 99.1 wt % in another embodiment. That is, from the standpoint of ensuring high conductivity of the formed bus electrode and better avoiding various kinds of damage after firing (cracking, peeling from the wafer, etc.), the inorganic solids content (wt %) may be 90 wt % or more in one embodiment or 94 wt % or more in another embodiment. In one embodiment, the inorganic solids content (wt %) may be 99.1 wt % or less from the standpoint of the printing properties.

Conductive Metal Particles and Glass Frit

The conductive metal particles and glass frit used are basically similar to the conductive metal particles and glass frit in the photocurable conductive paste for finger electrode discussed below. In the event that the conductive paste for bus electrode is used, there is little need to allow for the passage light for purposes of photocuring as with the finger electrode. Thus, the conductive metal particles may have a finer particle diameter. Specifically, the weight-average particle diameter (D50) can be nanoparticle size. For similar reasons, the shape of the conductive metal particles may be a flake shape or dendritic shape. A spherical or flake shape is preferred from the standpoint of availability.

Additional Components

Examples of other additional components include an organic solvent, resin binder, dispersant, stabilizer, plasticizer, antifoamer, wetting agent, viscosity and improver.

The organic solvent can basically be similar to the solvent in the photocurable conductive paste for the finger electrode discussed below.

Examples of the resin binder include ethyl cellulose resin, hydroxy ethyl cellulose resin, phenol resin and polymethacrylic acid ester resin. One of these may be used alone, or two or more may be used in combination.

Method of Application to Wafer

The method of applying the conductive paste for the bus electrode to the wafer is not particularly limited, and desirable examples include screen printing, die coater printing and gravure printing, and screen printing is preferred as one embodiment from the perspective of the printing properties.

In cases in which it is desirable to use the same conductive paste in order to simplify the steps of manufacturing the conductive paste for the bus electrode and the paste for the finger electrode, or to match the firing temperatures of the bus electrode and finger electrode, a photoinitiator or cross-linkable compound may also be included in the conductive paste for the bus electrode to the extent that this does not detract from the original intent or object of the present invention.

(b) Finger Electrode Pattern Formation Step

In this step a photocurable conductive paste for the finger electrode is discharged onto the wafer from the discharge slot of a dispenser nozzle as this nozzle is moved relatively in a specific direction along the wafer to thereby form an uncured finger electrode pattern on the wafer.

Photocurable Conductive Paste for Finger Electrode

In one embodiment, the photocurable conductive paste for the finger electrode contains conductive metal particles, glass frit, a cross-linkable compound and photopolymerization initiator, and an organic solvent.

In another embodiment, the content of the cross-linkable compound in the photocurable conductive paste for the finger electrode is 1.0 to 20.0 wt %, while the content of the photopolymerization initiator is 0.2 to 15.0 wt %, and the content of the organic solvent is more than 1.0 wt %. In this case, a solvent with a boiling point of 85° C. or more may constitute more than 90 wt % of the organic solvent composition.

In one embodiment, the inorganic solids content of the photocurable conductive paste for the finger electrode is smaller than the inorganic solids content of the conductive paste for the bus electrode.

Physical Properties, etc. of Photocurable Conductive Paste for Finger Electrode

Inorganic Solids

The inorganic solids content of the photocurable conductive paste for the finger electrode is calculated as the percentage (wt %) of inorganic solids relative to the total weight of the photocurable conductive paste for the finger electrode (excluding solvent). The inorganic solids typically consist of conductive metal particles and glass frit.

In one embodiment, the inorganic solids content is 40 to 96 wt %. In another embodiment it is 45 to 94 wt %. That is, from the standpoint of ensuring high conductivity the inorganic solids content may be 40 wt % or more in one embodiment, or 45 wt % or more in another embodiment. From the standpoint of increasing the photocuring speed, it may be 96 wt % or less in one embodiment or 94 wt % in a further embodiment.

Viscosity

The viscosity of the photocurable conductive pastes used for finger electorode in the present invention is 1 to 300 Pa·s in an embodiment. Specifically, a relatively low viscosity is about 1 to 100 Pa·s in an embodiment for increasing the discharge speed of the conductive paste, while 200 to 280 Pa·s is used in an embodiment for reducing the resistance value and increasing dispersibility in organic solvents. If the viscosity is less than 1 Pa·s, the inorganic particles are more likely to precipitate and separate, while if the viscosity exceeds 300 Pa·s, the nozzle unit is more likely to become clogged.

In the present invention, the viscosity of the conductive paste is a value obtained by measurement at 25° C., 10 rpm using a Brookfield HBT viscometer with a #14 spindle and a utility cup.

Manufacture of Photocurable Conductive Paste for Finger Electrode

The photocurable conductive paste for finger electrode can be manufactured and obtained by kneading aforementioned each component in a three-roll mill.

Electrically Conductive Metal Particles

The photocurable conductive paste for the finger electrode is conductive because it contains the aforementioned conductive metal particles.

In one embodiment, the electrically conductive metal particles used in the invention may be metal particles or metal alloy particles having electrical conductivity of not less than $1.00 \times 10^7$ S/m (siemens per meter) at about 20° C. Examples of such metal particles include iron (Fe; $1.00 \times 10^7$ S/m), aluminium (Al; $3.64 \times 10^7$ s/m), nickel (Ni; $1.45 \times 10^7$ S/m), copper (Cu; $5.81 \times 10^7$ S/m), silver (Ag; $6.17 \times 10^7$ S/m), gold (Au; $4.17 \times 10^7$ S/m), molybdenum (Mo; $2.10 \times 10^7$ S/m), magnesium (Mg; $2.30 \times 10^7$ S/m), tungsten (W; $1.82 \times 10^7$ S/m), cobalt (Co; $1.46 \times 10^7$ S/m) and zinc (Zn; $1.64 \times 10^7$ S/m). The metal particles can be used alone or in combination with other metal particles. In one embodiment the metal particles used in the photocurable conductive paste have an electrical conductivity of not less than $3.00 \times 10^7$ S/m (siemens per meter) at about 20° C. and such metal particles may be metal powders or metal alloy powders. It is understood that the use of conductive powders having higher electrical conductivity increases the conversion efficiency of solar cells.

In an embodiment, the metal powders are selected from the group comprising aluminum, copper, silver, gold, and combinations thereof. The metal powder is silver in another embodiment. Silver is commonly available and relatively inexpensive. In the event that a process for fabricating an electrode includes a firing, it is possible to fire silver metal under an oxygen-containing atmosphere, such as air, since silver is hardly susceptible to oxidation. The metal particles may be in the shape of flakes, spheres. In the present invention, metal particles having the same shape or different shapes may be used as a mixture. In an embodiment, metal particles in the shape of spheres are used when the paste is being used with a nozzle dispenser to provide the flowability and appropriate viscosity of the paste dispensed from the nozzle. The particle diameter ($d_{50}$) is within the range of 0.1 μm to 5.0 μm in an embodiment and 0.1 μm to 3.0 μm in another embodiment so as to discharge the paste in a predetermined amount from the pressurized nozzle. The particle diameter ($d_{50}$) can be measured using a particle size analysis meter ("Microtrack" particle size analyzer manufactured by Nikkiso K. K.). Normally, the silver has a high purity (greater than 99%). However, substances of lower purity can be used depending on the electrical requirements of the electrode pattern. Although there are no particular limitations on the silver content provided it is an amount that allows the object of the present invention to be achieved, the metal particle content is 40% to 95% in an embodiment and 70% to 90% in another embodiment, by weight based on the weight of the paste.

Glass Frits

There are no particular limitations on glass frit. Any glass composition suitable for making a conductive paste for electronic applications is suitably used in the present invention. For example, lead borosilicate glass may be used. Lead borosilicate glass is a superior material from the standpoint of both the range of the softening point and glass adhesion. In addition, lead-free glass such as a bismuth silicate lead-free glass can also be used.

When the conductive paste is used in the present inventive method for fabricating solar cell electrodes, the softening point of the glass is in the range of 300° C.-600° C. in an embodiment, in the range of 320° C.-520° C. in another embodiment and firing is carried out at a temperature of between 600° C. and 900° C. The fired electrode reacts with and penetrates the insulating film, forming electrical contact with the silicon wafer. The glass softens sufficiently to proceed with firing properly at the firing temperature, so the softening point is >300° C. in an embodiment, >320° C. in another embodiment. On the other hand, from the viewpoint of melting flowability, adhesion strength and liquid-phase firing, the softening point is <600° C. in an embodiment, <520° C. in another embodiment. Although there are no particular limitations on the content of the inorganic binder in the form of the glass frit provided it is an amount that allows the object of the present invention to be achieved, it is 0.5% to 15.0% by weight in an embodiment and 1.0% to 10.0% in another embodiment by weight based on the weight of the paste. If the amount of the inorganic binder is less than 0.5% by weight, adhesive strength may become inadequate. If the amount of the inorganic binder exceeds 15.0% by weight, problems may be caused in the subsequent soldering step due to floating glass. In addition, the resistance value as a conductor also increases.

Photo Polymerization Initiator

The photocurable conductive pastes used for finger electrode in the present invention contain a photo polymerization initiator in the form of a radical photo polymerization initiator or a cationic photo polymerization initiator. The photo polymerization initiator is thermally inactive at 185° C. or lower in an embodiment, but it generates a free radical or acid when it is exposed to chemical rays. When the photocurable monomer component used in the present invention contains polymerizable ethylenically unsaturated compound, the radical photo polymerization initiator is used. When the photocurable monomer component used in the present invention contains cationic polymerizable monomer, the cationic photo polymerization initiator is used.

The photo polymerization initiator may be used singly or two or more kinds may be used in combination.

The content of the photo polymerization initiator is in the range of 0.2-15.0 wt % in an embodiment, 0.2-10.0 wt % in another embodiment, and 1.0-5.0 wt % in another embodiment, based on the total amount of the photocurable conductive paste. From the viewpoint of appropriate photo-curalability, the content of the photo polymerization initiator is greater than 0.2 wt % in an embodiment, and greater than 1.0 wt % in another embodiment, based on the total amount of the photo-curable conductive paste. From the viewpoint of resistance and solubility, the content of the photo polymerization initiator is less than 15.0 wt % in an embodiment, 10 wt % in another embodiment, and 5 wt % in another embodiment, based on the total amount of the photo-curable conductive paste.

(1) Radical Photo Polymerization Initiator

The radical photo polymerization initiator is used for photo-polymerizing the radical polymerization-type monomer and it generates a free radical when it is exposed to chemical rays. The radical photo polymerization initiator is not particularly limited, but well known radical photo polymerization initiators can be employed. Examples of the photo polymerization initiator include compounds having two intramolecular rings in a conjugated carbon ring. Practical examples include: 9,10-anthraquinone, 2-methylanthraquinone, 2-ethylanthraquinone, 2-t-butylanthraquinone, octamethylanthraquinone, 1,4-naphtoquinone, 9,10-phenanthrenequinone, benzo[a]anthracene-7,12 dione, 2,3-naphtacene-5,12-dione, 2-methyl-1,4-naphtoquinone, 1,4-dimethylanthraquinone, 2,3-dimethylanthraquinone, 2-phenylanthraquinone, 2,3-diphenylanthraquinone, retenequinone, 7,8,9,10-tetrahydronaphtacene-5,12-dione and 1,2,3,4-tetrahydrobenzo[a]anthracene-7,12-dione.

Other compounds that may be used include those given in U.S. Pat. Nos. 2,850,445, 2,875,047, 3,074,974, 3,097,097, 3,145,104, 3,427,161, 3,479,185, 3,549,367, and 4,162,162.

Other examples include: Ethyl-4-(dimethylamino)-benzoate, 2,4-Diethylthioxanthone, 2-Methyl-1[4-(methylthio)phenyl]-2-morpholinopropnane-1-one, 2-benzil-2-dimethylamino-1-(4-morpholinophenyl)-butanone-1,2 (dimethylamino)-2-[(4-methylphenyl)methyl]-1-[4-(4-phenylthio)-,2-(O-benzoyloxime)](IRGACURE OXE01 (BASF), Formula (I) below

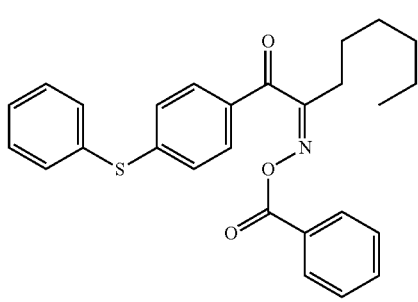

(I)

ethanone,1-[9-ethyl-6-(2-methyl benzoyl)-9H-carbazole-3-yl]- and 1-(O-acetyloxime) (IRGACURE OXE01(BASF), Formula (II) below

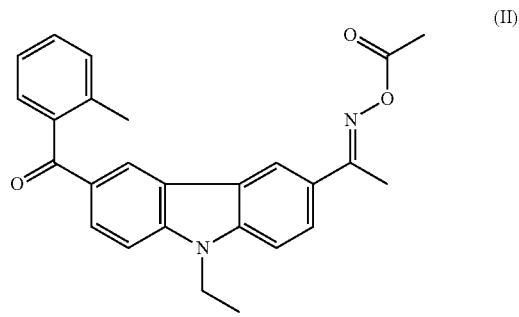 [SMILES: CCn1c2ccc(C(=O)c3ccccc3C)cc2c2cc(/C(C)=N/OC(C)=O)ccc21]

(II)

These may be used alone or two or more thereof may be used in combination.

(2) Cationic Photo Polymerization Initiator

The cationic photo polymerization initiator is used for photo-polymerizing the cationic polymerization-type monomer with generating acid when it is exposed to chemical rays. The cationic photo polymerization initiator is not particularly limited, but well known cationic photo polymerization initiator can be employed. Practically, aromatic onium compound salts, salts of sulfonic compounds, halide compounds, or iron arene complex can be used. The aromatic onium compound salts generate Lewis acid or Bronsted acid when they are exposed to light. The aromatic onium compound salts, such as, the compound salts comprising; $B(C_6F_5)_4^-$, $PF_6^-$, $AsF_6^-$, $SbF_6^-$ or $CF_3SO_3^-$ and aromatic onium compounds such as, aromatic diazonium, aromatic ammonium, aromatic iodonium, aromatic sulfonium, or aromatic phosphonium can be used. Among these salts, aromatic iodonium salts and aromatic sulfonium salts are used in an embodiment. For example, sulfonium compound salts, such as $(Ar^1)(Ar^2)(Ar^3)S^+X^-$ type ($Ar^1$ and $Ar^2$ are, for example, 4-fluorophenyl group, $Ar^3$ is -Ph-S—P—CO-Ph, $X^-=PF_6^-$) and iodonium compound salts, such as $(Ar^1)(Ar^2)I^+X^-$type ($Ar^1$ is, for example, 4-(2-propyl) phenyl group, and $Ar^2$ is, for example, p-toluyl group, $X^-=PF_6^-$) are used in an embodiment. The sulfonated compounds generate sulfonic acid when they are exposed to light. As the sulfonium compounds, such as, $PhCOCH_2SO_2Ph$, (p-Tol) $SO_2$ $OCH_2(2,6-DNP)$ (p-Tol is p-toluyl group, 2,6-DNP is 2,6-di-nitro phenyl group) are employed. The halogen compounds generate halogenated hydrogen when exposed to light. As the halogen compounds, such as (4-Cl Ph)$_2$CHCCl$_3$, PhSO$_2$CBr$_3$ are used. The iron arene complexs generate Lewis acid when exposed to light. As the iron arene complex, such as $[C_5H_5HFe(CO)_3]^+PF_6^-$ are used.

Cross-Linkable Agents

The conductive paste used for finger electrode in the present invention is photo-curable because it contains the aforementioned cross-linkable agent (compound) and photo polymerization initiator. That is, the aforementioned cross-linkable compound is polymerized and cured by free radicals or acid generated by the photo polymerization initiator. It also has the effect of providing plasticity to the resin binder. Examples of this cross-linkable agent include ethylenically unsaturated compounds and cationic polymerizable compounds. A cross-linkable compound with a low molecular weight is desirable for providing suitable plasticity and fluidity to the conductive paste.

On the other hand, a cross-linkable compound with a high molecular weight is desirable because it has an effect of stabilizing dispersion of the inorganic particles. The content of the cross-linkable compound in the conductive paste is 1.0 to 20 wt % in an embodiment or 5.0 to 15 wt % in another embodiment. From the standpoint of smooth photocuring and the fluidity and discharge performance of the conductive paste, the content is at least 1.0 wt % in an embodiment or at least 5.0 wt % in another embodiment, while for purposes of obtaining a sufficiently viscous conductive paste, as well as a satisfactory film thickness, an aspect value and a suitable resistance value of the formed electrode, the content is 20 wt % or less in an embodiment, or 15 wt % or less in another embodiment.

As the ethylenically unsaturated compound a cross-linkable compound having at least one polymerizable ethylene group can be used. Such a compound can cause the formation of the polymer, depending on the presence of free groups, and a chain-extending addition polymerization can take place. The monomer compound has a non-gas form, that is, it has a boiling point higher than 100° C. and can provide plasticity to the organic polymeric binder. Monomers that can be used either alone or in combination with other monomers include methyl-metacrylate, ethyl-metacrylate, n-buthyl-metacrylate, t-butyl(meth)acrylate, t-buthyl(meth)acrylate, 1,5-pentanediol di(meth)acrylate, (N,N-dimethyl aminoethyl(meth)acrylate, ethyle glycol di(meth)acrylate, 1,4-butanediol di(meth)acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylolpropane di(meth)acrylate, glycerol di(meth)acrylate, tripropylene glycol di(meth)acrylate, glycerol tri(meth)acrylate, trimethylolpropane tri(meth)acrylate, compounds disclosed in U.S. Pat. No. 3,380,381, compounds disclosed in U.S. Pat. No. 5,032,490, 2,2-di(p-hydroxyphenyl)-propane di(meth)acrylate, pentaerythritol tetra(meth)acrylate, triethylene glycol diacrylate, polyoxyethyl-1,2-di-(p-hydroxyethyl)propane dimethacrylate, bisphenol A di-[3-(meth)acryloxy-2-hydroxypropyl)ether, bisphenol A di-[2-(meth)acryloxyethyle)ether, 1,4-butanediol di-(3-methacryloxy-2-hydroxypropyl)ether, triethylene glycol dimethacrylate, polyoxypropyl trimethyrol propane triacrylate, trimethylolpropane ethoxytriacrylate, butylene glycol di(meth)acrylate, 1,2,4-butanediol tri(meth)acrylate, 2,2,4-trimethyl-1,3-pentanediol di(meth)acrylate, 1-phenylethylene-1,2-dimethacrylate, diallyl fumarate, styrene, 1,4-benzenediol dimethacrylate, 1,4-diisopropenyl benzene, and 1,3,5-triisopropenyl benzene, mono hydroxy polycaprolactone mono acrylate, poly ethylene glycol diacrylate and polyethylene glycol dimetacrylate (in this case, "(meth)acrylate" includes both "acrylate and methacrylate)". The above polymerizable ethylenically unsaturated compound may be modified, for example, polyoxyethylated, or ethylated. Moreover, inorganic powder dispersal may be stabilized and the strength of a dried film may be enhanced by using an ethylenically unsaturated compound comprising an ethylenically unsaturated group added to an epoxy, polyether, polyester, polyurethane or other polymer chain. One such ethylenically unsaturated compound may be used alone, or a combination of two or more may be used.

The cationic polymerizable compound is also the cross-linkable agent used in the present invention, having at least one functional group, for example, an epoxy group, oxetane ring and vinyl ether, that is polymerizable in the presence of an acid. This cross-linkable agent is non-gaseous with a boiling point above 100° C. in an embodiment. Polymerization of this cationic polymerizable compound may be initiated by moisture and other impurities in the air. This makes environmental control difficult when the paste is used for screen-printing. When it is used in a nozzle dispenser, on the other hand, it is easy to handle because it can be stored in a sealed container until immediately before the process.

Epoxy compounds that can be used as the cationic polymerizable compound are monomers or oligomers of compounds having epoxy groups, such as aromatic epoxy compounds, alicyclic epoxy compounds and aliphatic epoxy compounds. When an oligomer is used, it is non-gaseous with a boiling point above 100° C. in an embodiment. Examples of the aromatic epoxy compounds include di- or polyglycidyl ethers produced by reacting epichlorohydrin with a polyvalent phenol or alkylene oxide adduct thereof having at least one aromatic nucleus, and more specific examples include di- or polyglycidyl ethers of bisphenol A or its alkylene oxide adduct, di- or polyglycidyl ethers of hydrogenated bisphenol A or its alkylene oxide adduct, and Novolac epoxy resin. Examples of the alicyclic epoxy compounds include cyclohexene oxide and cyclopentene oxide. Examples of the aliphatic epoxy compounds include di- or polyglycidyl ethers of aliphatic polyvalent alcohols or their alkylene oxide adducts, and more specific examples include diglycidyl ethers of ethylene glycol, propylene glycol, 1,6-hexanediol and other alkylene glycols; polyglycidyl ethers of glycerin and other polyvalent alcohols; and diglycidyl ethers of polyethylene glycol, polypropylene glycol and other polyalkylene-oxyglycols.

Compounds having oxetane rings can also be used as the cationic polymerizable compound, and these include monofunctional oxetane compounds and polyfunctional oxetane compounds. Examples of monofunctional oxetane compounds include 3-ethyl-3-hydroxymethyloxetane, 4-fluoro-[1-(3-ethyl-3-oxetanylmethoxy)methyl]benzene, 4-methoxy-[1-(3-ethyl-3-oxetanylmethoxy)methyl]benzene, isobutoxymethyl(3-ethyl-3-oxetanylmethyl)ether and other monofunctional oxetanes. Examples of polyfunctional oxetanes include 3,7-bis(3-oxetanyl)-5-oxa-nonane, 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl) ether, triethylene glycol and bis(3-ethyl-3-oxetanylmethyl) ether.

Vinyl ether compounds can also be used as the cationic polymerizable compound, and these include monofunctional vinyl ethers and polyfunctional vinyl ethers. Examples of monofunctional vinyl ethers include methyl vinyl ether, ethyl vinyl ether, propyl vinyl ether, n-butyl vinyl ether and t-butyl vinyl ether. Examples of polyfunctional vinyl ethers include ethylene glycol divinyl ether, diethylene glycol divinyl ether, polyethylene glycol divinyl ether, propylene glycol divinyl ether and butylene glycol divinyl ether.

Organic Solvent

The main purpose of using an organic solvent is so that the dispersion of the finely pulverized solid content of the aforementioned composition can be easily coated on wafers. Consequently, first of all, the organic solvent is able to disperse the solid content while maintaining the proper stability. Secondly, the rheological characteristics of the organic solvent provides the dispersion with a good coating characteristic.

In one embodiment, the organic solvent is used in the conductive paste to decrease the paste viscosity as well as to dissolve or disperse the each component (photo polymerization initiator, etc.) in the conductive paste. The content of the organic solvent in the conductive paste used for the finger electrode in the present invention is over 1.0 wt %, based on the total weight of the paste in one embodiment. When the content of the organic solvent is equal to or below 1.0 wt %, it may become very difficult to dissolve or disperse the components in the conductive paste properly, and uniformly. As a result, to form fine and uniform lines on the wafer through a discharge slot of a nozzle dispenser may be difficult and forming electrodes with uniform and fine line width on the wafer will become difficult. On the other hand, too much content of the organic solvent in the paste can affect the photosensitivity of the electrodes in an adverse way. From that point of view, in one embodiment, the content of the organic solvent is less than 5.2 (wt %), based on the total weight of the conductive paste.

In addition, as for the above organic solvent composition, more than 90 wt % of the organic solvent component is organic solvent having a boiling point equal to or greater than 85° C. at 1 atmosphere pressure in one embodiment. When more than 90 wt % of the organic solvent component has a low boiling point (less than 85° C.), part of the organic solvent will be boiled away during the process and the composition of the paste, the viscosity of the paste and so on will be changed. The boiling point of the organic solvent is more than 90° C. in an embodiment, more than 100° C. in another embodiment. The organic solvent, having rather high boiling point (equal to or more than 85° C.) used in the present invention includes, for example, aliphatic alcohols, acetic esters, propionic esters, or the esters of the aforementioned alcohols; pine oil, α- or β-terpineol, or their mixture, or other terpinenes; ethylene glycol, di-ethylene glycol, ethylene glycol monobutyl ether, butyl Cellosolve acetate, or other esters of ethyelene glycols; butyl Carbitol, butyl Carbitol acetate, Carbitol acetate, or other carbitol esters; Texanol (2,2,4-trimethyl-1, 3-pentanediol monoisobutyrate) and other appropriate solvents. These may be used alone, or two or more thereof may be used in combination. For example, the boiling point of Texanol is 255-260° C., the boiling point of butyl Carbitol acetate is 246.8 to 247° C., the boiling point of terpineol is 219° C., and the boiling point of di-ethylene glycol is 244° C.

Additional Components

The conductive paste for finger electrode may further comprise one or more additives, for example, polymeric binder, dispersants, stabilizers, plasticizers, antifoamers, wetting agents, thickeners and rheology modifiers. When the polymeric [resin] binder is included in the conductive paste, the content of the polymeric binder in the conductive paste may be small in order to obtain a satisfactory photocuring speed. Specifically, the content is 1.0 wt % or less in an embodiment. Examples of the polymeric binder include copolymers or interpolymers prepared from (a) non-acidic comonomers containing $C_{1-10}$ alkyl acrylates, $C_{1-10}$ alkyl methacrylates, styrene, substituted styrene or combinations of these, and (b) acidic comonomers having ethylenically unsaturated carboxylic acid-containing parts. One of these may be used alone, or a combination of two or more may be used.

Method of Application to Wafer

The finger electrode pattern formation step is a step in which the photocurable conductive paste for the finger electrode is discharged onto the wafer from a discharge slot of a dispenser nozzle as this nozzle is moved relatively in a specific direction along the wafer to thereby form an uncured finger electrode pattern on the wafer.

The dispenser here is a discharge device having a nozzle and capable of applying, filling and including a high-viscosity paste or other high-viscosity fluid in small quantities from the nozzle, and one example is the Image Master 350PC manufactured by Musashi Engineering.

The conductive paste for finger electrode adheres sequentially to the wafer by being discharged continuously without interruption in a direction opposite the direction of relative movement of the nozzle unit.

The shape of the discharge slot is not particularly limited, and a variety of shapes including circular and rectangular are possible according to the properties of the conductive paste and the shape of the electrode being formed. The minimum inner diameter of the discharge slot is not particularly limited, but is 5 to 100 μm or more in an embodiment, 10 to 50 μm in another embodiment, considering the light-receiving area of the formed solar cell. The number of discharge slots in the nozzle unit is not particularly limited, and there may be one discharge slot or multiple discharge slots. In particular, a nozzle unit having multiple discharge slots of the same shape and size is desirable for forming an electrode efficiently. The discharge slot (or nozzle unit) may also move relatively along the wafer in a specific direction at a specific angle to the wafer, or may move relatively along the wafer in a specific direction while maintaining a perpendicular position relative to the wafer. The means by which the nozzle unit is moved relatively along the wafer in a specific direction is not particularly limited. For example, the nozzle unit may be fixed, while the wafer is mounted on an X-Y stage having an X-Y movement mechanism, and relative movement is accomplished by moving this movement mechanism so as to move the stage in the Y direction. The speed of the relative movement between the nozzle unit and the wafer is not particularly limited, but is 1 to 500 mm/s or more in an embodiment, 10 to 500 mm/s in another embodiment, considering the viscosity of the conductive paste used and the efficiency of discharge and coating.

(c) UV Light Irradiation Step to Finger Electrode Pattern

The UV light irradiation step is a step of exposing finger electrode pattern formed on the wafer to UV light. The irradiance level of the UV light is 10 to 1000 mJ/cm$^2$ in an embodiment in order to effectively form an electrode by efficient photocuring. In the UV light irradiation step, all of the (uncured) finger electrode patterns (or multiple patterns) can be formed first on the wafer in the finger electrode pattern formation step, after which these formed finger electrode patterns are exposed together to UV light. Alternatively, UV light irradiation can be performed successively for each finger electrode pattern formed on the wafer in the finger electrode pattern formation step. The latter is used in an embodiment from the standpoint of manufacturing a finger electrode pattern with a high aspect ratio. In this case in particular, it is desirable to perform UV light irradiation within 10 seconds after the electrode pattern is formed in order to obtain a suitable coating speed while preventing liquid dripping, although this also depends on the size of the finger electrode pattern. In this embodiment, the irradiance level of the UV light is about 100 to 1000 mJ/cm$^2$ in an embodiment when there is no firing step as explained below.

(d) Other Steps

Other steps include a firing step. The method of firing is not particularly limited, but for example firing for about 1 to 15 minutes at a temperature of about 600 to 900° C. in a typical infrared firing furnace is desirable. As explained above, with the method for producing a solar cell electrode of the present invention it is possible to efficiently provide a solar cell electrode with a high aspect ratio by using the aforementioned conductive paste.

Solar Cell Electrode

The solar cell electrode of the second embodiment of the present invention is manufactured by the solar cell electrode production method of the first embodiment of the present invention. Thus, it is formed efficiently as an electrode with a high aspect ratio and a small line width. An aspect ratio of 0.3 to 3.0 is desirable. The line width is 10 to 100 μm or more in an embodiment, 20 to 100 μm in another embodiment.

EXAMPLES

The practical examples will be explained in further detail. The scope of the present invention, however is not limited in any way by these practical examples.

(Manufacturing Example: Preparation of Conductive Paste)

Silver powder (average particle size of powder (D50)=2.2 or 3.2 μm, spherical), bismuth-based glass frit, and the other components shown in Table 1 were mixed in the compounded amounts shown in Table 1 (Conductive pastes 1 to 4). The resulting mixtures were pre-mixed in a Thinky mixer, and kneaded in a 3-roll mill to obtain the Conductive Pastes 1 to 4 shown in Table 1.

In the Examples and Comparative Examples shown below, Conductive paste 1 was used as the conductive paste for the bus electrode, while Conductive pastes 2 to 4 were used as the conductive paste for the bus electrode or the photocurable conductive paste for the finger electrode.

Example 1

Solar cell electrode 1 was prepared as follows using the Conductive Paste 1 obtained in the aforementioned manufacturing example as the conductive paste for the bus electrode, and the Conductive Paste 2 as the photocurable conductive paste for the finger electrode.

1) A 1.5 inch square silicon wafer was prepared, and a bus electrode 2 mm wide and 34 mm long was formed at an coating speed of 100 to 200 mm/second on the silicon wafer using a screen printing device (device name: MC212, C. W. Price Co. Inc.) with a stainless #250 mesh print mask. This was then dried for 5 minutes in a blast oven (device name: PVC-231, Espec Corp.) set to 150° C. The dried film thickness was adjusted to about 30 mm.

2) Using a Musashi Engineering Image Master 350PC as the dispenser (dispensing system unit), a finger electrode was then manufactured as described in 3) below on this device with a UV light source (LED system, exposing region of diameter about 10 mm) provided beside the nozzle. The lengthwise direction of this finger electrode is the direction perpendicular to the lengthwise direction of the bus electrode, and there is some overlap at the points of contact with the bus electrode.

TABLE 1

| Paste composition | Conductive Paste1 | Conductive Paste2 | Conductive Paste3 | Conductive Paste4 |
|---|---|---|---|---|
| Silver particle | (80.87 pts.wt.) | (80.87 pts.wt.) | (80.87 pts.wt.) | (80.00 pts.wt.) |
| d50(μm) | 2.20 μm | 2.20 μm | 2.20 μm | 3.20 μm |
| Bismuth-base glass frit | (3.32 pts.wt.) | (3.32 pts.wt.) | (3.32 pts.wt.) | (2.00 pts.wt.) |
| Zinc Oxide | (4.71 pts.wt.) | (4.71 pts.wt.) | (4.71 pts.wt.) | — |
| Surfactant | (0.62 pts.wt.) | (0.62 pts.wt.) | (0.62 pts.wt.) | — |
| Photo polymerization initiator | — | *1 (1.28 pts.wt.) *2 (0.51 pts.wt.) | *1 (1.28 pts.wt.) *2 (0.51 pts.wt.) | *1 (1.00 pts.wt.) *2 (0.50 pts.wt.) |
| Cross-linkable agent | — | *3 (4.00 pts.wt.) | *3 (7.50 pts.wt.) | *4 (9.2 pts.wt.) |
| Stabilizer | — | *5 (0.10 pts.wt.) | *5 (0.10 pts.wt.) | *5 (0.05 pts.wt.) |
| Polymeric binder | *6 (0.22 pts.wt.) | *6 (0.11 pts.wt.) | — | *7 (6.00 pts.wt.) |
| Organic solvent | Texanol(*9) (3.71 pts.wt.)/Terpineol (7.7 pts.wt.) | Texanol(*9) (1.80 pts.wt.)/Terpineol (3.36 pts.wt.) | — | BCA/(0.40 pts.wt.) (*9)/Texanol (0.40 pts.wt.) |
| Dispersant | — | — | — | *8 (0.45 pts.wt.) |
| Total (pts.wt.) | 101.15(pts.wt.) | 100.68(pts.wt.) | 98.91(pts.wt.) | 100.0(pts.wt.) |
| Solid components (wt %) *10 | 87.89(wt %) | 88.30(wt %) | 89.88(wt %) | 82.00(wt %) |
| Inorganic solids (solid components wt %) excluding solvent (organic solvent). *11 | 99.06(wt %) | 93.07(wt %) | 89.88(wt %) | 82.66(wt %) |

*1: 1-methyl-1[4-(methylthio)phenyl]-2-morpholinopropanone-1-one
*2: 2,4-Diethylthioxantone
*3: Etoxylated pentaerythritol tetraacrylate(Sartomer corporation manufactured, SR494 ®)
*4: Pentaerythritol tetraacrylate(Sartomer corporation manufactured, SR295 ®)
*5: BHT butylated hydroxytoluene lonol
*6: Ethylcellulose(Etcel ® Dow Chemical Co.)
*7: Urethane acrylate(UA-510H, Kyoeisha chemical Co., ltd.)
*8: Fatty acids, tall-oil, compds with n-tallow alkyltrimethylenediamines(DUOMEEN ® TDO)*
*9: Boiling point of Texanol: 255-260° C., Boiling point of BCA(=Butyl carbitol acetate): 246.8-247.
*10: Shows weight (%) of inorganic solids relative to total weight of conductive paste including solvent.
*11: Shows weight (%) of inorganic solids relative to total weight of conductive paste excluding solvent, corresponding to inorganic solids content as defined for the conductive paste for the bus electrode and the photocurable conductive paste for the finger electrode.
*12: Viscosity value of each Conductive Pastes1-4 was obtained by measurement at 25° C., 10 rpm using a Brookfield HBT viscometer with a #14 spindle and a utility cup, as shown in Table2.

TABLE 2

| Conductive Paste | Conductive Paste1 | Conductive Paste2 | Conductive Paste3 | Conductive Paste4 |
|---|---|---|---|---|
| Viscosity (Pa · s) (10 rpm, 25° C.)) | 18.0 | 121.0 | 326.0 | 174.0 |

An Execure-LE-1V manufactured by Hoya Candeo Optronics was used as the UV light source. The minimum inner diameter of the nozzle part was 50 μm, and the nozzle part was provided with only 1 discharge slot.

3) The 1.5 inch square silicon wafer with the formed bus electrode was set on the X-Y stage of the device prepared in 1). The Conductive Paste 2 prepared in the manufacturing example was then discharged from the nozzle as the nozzle was moved in the X direction relative to the silicon wafer and the silicon wafer was moved in the Y direction relative to the nozzle, to form an electrode pattern 80 μm wide and 34 mm long on the silicon wafer. The rate of movement of the nozzle relative to the wafer was 10 mm/s. The UV light source (LED system) was set about 50 mm behind the nozzle in the drawing direction. Thus, 5 seconds after the finger electrode pattern was formed it was exposed to UV light for 1 minute to photocure the pattern. The cumulated irradiance level of the UV light at this time was 250 mJ/cm$^2$.

Example 2

Solar cell electrode 2 was manufactured as in Example 1, using Conductive Paste 1 obtained in the manufacturing example as the conductive paste for the bus electrode and Conductive paste 3 as the photocurable conductive paste for the finger electrode.

Comparative Example 1

Comparative solar cell electrode 1 was manufactured as in Example 1 using Conductive Paste 2 obtained in the manufacturing example for forming both the bus electrode and the finger electrode.

Comparative Example 2

Comparative solar cell electrode 2 was manufactured as in Example 1 using Conductive Paste 3 obtained in the manufacturing example for forming both the bus electrode and the finger electrode.

Comparative Example 3

Comparative solar cell electrode 3 was manufactured as in Example 1 using Conductive Paste 4 obtained in the manufacturing example for forming both the bus electrode and the finger electrode.

(Evaluating physical properties of solar cell electrodes)

The solar cell electrodes obtained in the examples and comparative examples above were fired for 1.3 minutes at a maximum temperature of 880° C. in a firing furnace (Despatch Industries, device name: CF7210D), and the bus electrode part and finger electrode part were observed either by naked eyes or under an optical microscope after firing.

(Results)

As a result, no cracking or peeling from the silicon wafer was observed with the bus electrode obtained in Example 1. In Example 1, the finger electrode was also formed properly, and no cracking or peeling from the silicon wafer was observed.

As in Example 1, no cracking or peeling from the silicon wafer was observed with the bus electrode obtained in Example 2. However, in Example 2, some irregularity of line width was observed in the finger electrode, although not at a level that would be a problem for actual use. Almost no cracking or peeling from the silicon wafer was observed after firing.

Cracking and peeling from the silicon wafer were observed with the bus electrodes of comparative solar cell electrodes 1 to 3 of Comparative Examples 1 to 3. In particular, considerable cracking and peeling from the silicon wafer was observed with the bus electrodes of comparative solar cell electrodes 2 to 3.

The finger electrode of comparative solar cell electrode 1 of Comparative Example 1 was formed properly, and no cracking or peeling from the silicon wafer was observed. In the finger electrodes of comparative solar cell electrodes 2 to 3 of Comparative Examples 2 to 3, the line width was irregular and pattern formation was poor. Considerable cracking and peeling from the silicon wafer were observed after firing, and it was not possible to form electrodes suited to actual use.

What is claimed is:

1. A method for manufacturing a solar cell electrode, comprising the steps of: (a) applying a conductive paste for bus electrode to a wafer in order to form a bus electrode pattern; (b) depositing onto the wafer a photocurable conductive paste for finger electrode from a discharge slot of a dispenser nozzle to thereby form an uncured finger electrode pattern on the wafer, wherein the nozzle moves parallel to the wafer; and (c) curing the uncured finger electrode pattern by exposing the uncured finger electrode pattern to UV light either after forming the uncured finger electrode pattern on the wafer in the step (b), or concurrent with the step (b), and further comprising a step (d) of firing the cured electrode pattern after the step (c), wherein the photocurable conductive paste for finger electrode comprises conductive metal particles, glass frits, a cross-linkable compound, a photopolymerization initiator and an organic solvent, and wherein the cross-linkable compound is 1.0 to 20.0 wt %, the photopolymerization initiator is 0.2 to 15.0 wt % and the organic solvent is above 1.0 wt % based on the total weight of the photocurable conductive paste for finger electrode, and wherein a solvent with a boiling point of 85° C. or more constitutes more than 90 wt % of the organic solvent composition, and wherein the content of inorganic solids of the conductive paste for bus electrode is higher than the content of inorganic solids of the photocurable conductive paste for finger electrode.

2. A method of claim 1, wherein the conductive paste for bus electrode comprises conductive metal particles and glass frits, and wherein the content of inorganic solids of the conductive paste for bus electrode is 94 to 99.1 wt %.

3. A method of claim 1, wherein the conductive paste for bus electrode is screen-printed onto the wafer.

4. A method of claim 1, wherein the viscosity at 10 rpm and 25° C. of the photocurable conductive paste for finger electrode is 1 to 300 Pa·s.

5. A method of claim 1, wherein the glass fits in the photocurable conductive paste for finger electrode is 0.5 to 15.0 wt % based on the total weight of the photocurable conductive paste.

6. A method of claim 1, wherein the conductive metal particles in the photocurable conductive paste for finger electrode is 40.0 to 95.0 wt % based on the total weight of the photocurable conductive paste.

7. A method of claim 1, wherein the conductive metal particles in the photocurable conductive paste for finger electrode are spherical.

8. A method of claim 1, wherein the content of inorganic solids of the photocurable conductive paste for finger electrode is 40 to 96 wt % based on the total weight of the photocurable conductive paste.

9. A method of claim 1, wherein weight-average particle diameter (D50) of the conductive metal particles in the photocurable conductive paste for finger electrode is 0.1 to 5.0 µm.

10. A method of claim 1, wherein minimum inner diameter of the discharge slot of the dispenser nozzle is 5 to 100 µm.

11. A method of claim 1, wherein the moving speed of the nozzle at the step (b) is 1 to 500 mm/s.

12. A method of claim 1, wherein the irradiation dose of the UV light is 10 to 1000 mJ/cm$^2$.

\* \* \* \* \*